(12) United States Patent
Wang et al.

(10) Patent No.: US 8,791,403 B2
(45) Date of Patent: *Jul. 29, 2014

(54) LENS ARRAY FOR PARTITIONED IMAGE SENSOR TO FOCUS A SINGLE IMAGE ONTO N IMAGE SENSOR REGIONS

(75) Inventors: Chia-Wei Wang, Luzhu Township (TW); Jau-Jan Deng, Taipei (TW); Yun-Chiang Hsu, Yangmei (TW)

(73) Assignee: OmniVision Technologies, Inc., Santa Clara, CA (US)

( * ) Notice: Subject to any disclaimer, the term of this patent is extended or adjusted under 35 U.S.C. 154(b) by 266 days.

This patent is subject to a terminal disclaimer.

(21) Appl. No.: 13/486,787

(22) Filed: Jun. 1, 2012

(65) Prior Publication Data

US 2013/0320195 A1    Dec. 5, 2013

(51) Int. Cl.
*H01J 3/14*      (2006.01)
*H01J 5/16*      (2006.01)
*H01L 27/146*    (2006.01)
*H01L 31/0216*   (2014.01)

(52) U.S. Cl.
CPC .... *H01L 27/14627* (2013.01); *H01L 31/02162* (2013.01)
USPC ......... 250/216; 250/214.1; 348/340; 359/619

(58) Field of Classification Search
CPC ............... H01L 31/09; H01L 31/1013; H01L 27/14647; H01L 27/14645; H01L 27/14667; H01L 27/14627; H01L 27/14621; H01L 31/02162
USPC ........ 250/216, 208.1, 214.1, 214 R; 348/340, 348/218.1, 262–265, 272, 277; 257/431–433; 359/619
See application file for complete search history.

(56) References Cited

U.S. PATENT DOCUMENTS

| | | | |
|---|---|---|---|
| 7,247,851 B2* | 7/2007 | Okada et al. | 250/339.02 |
| 7,453,510 B2 | 11/2008 | Kolehmainen et al. | |
| 7,812,869 B2 | 10/2010 | Boettiger | |
| 2002/0089596 A1 | 7/2002 | Suda | |
| 2006/0023314 A1 | 2/2006 | Boettiger et al. | |
| 2007/0008421 A1 | 1/2007 | Wu et al. | |

(Continued)

FOREIGN PATENT DOCUMENTS

EP    2214405 A2    8/2010

OTHER PUBLICATIONS

EP 13167195.0—European Search Report and Search Opinion, dated Nov. 6, 2013 (11 pages).

*Primary Examiner* — Francis M Legasse, Jr.
(74) *Attorney, Agent, or Firm* — Blakely Sokoloff Taylor & Zafman LLP

(57) ABSTRACT

An apparatus includes an image sensor having N image sensor regions arranged thereon. A lens array having a including N lens structures is disposed proximate to the image sensor. Each one of the N lens structures is arranged to focus a single image onto a respective one of the N image sensor regions. The N lens structures include a first lens structure having a first focal length and positioned the first focal length away from the respective one of the N image sensor regions. A second lens structure having a second focal length is positioned the second focal length away from the respective one of the N image sensor regions. A third lens structure having a third focal length is positioned the third focal length away from the respective one of the N image sensor regions. The first, second and third focal lengths are different.

15 Claims, 9 Drawing Sheets

(56) References Cited

U.S. PATENT DOCUMENTS

| | | |
|---|---|---|
| 2007/0126898 A1* | 6/2007 | Feldman et al. ............. 348/294 |
| 2008/0049126 A1 | 2/2008 | Ford et al. |
| 2008/0128843 A1 | 6/2008 | Lee |
| 2008/0142685 A1 | 6/2008 | Gazeley |
| 2010/0065897 A1 | 3/2010 | Jun |
| 2012/0104525 A1 | 5/2012 | Wu et al. |
| 2014/0043507 A1* | 2/2014 | Wang et al. ................... 348/267 |

* cited by examiner $f1 \neq f2$

LENS ARRAY FOR PARTITIONED IMAGE SENSOR TO FOCUS A SINGLE IMAGE ONTO N IMAGE SENSOR REGIONS

BACKGROUND INFORMATION

1. Field of the Disclosure

The present invention relates generally to image sensors, and more specifically, to a lens array for a partitioned image sensor.

2. Background

An image capture unit typically includes an image sensor and an imaging lens. The imaging lens focuses light onto the image sensor to form an image, and the image sensor converts the light into electric signals. The electric signals are output from the image capture unit to other units in a host electronic system or a subsystem. The electronic system may be a mobile phone, a computer, a digital camera or a medical device.

As the use of image capture units in electronic systems increases, so do the demands for image capture unit features, capabilities and device dimensions. For example, image capture units are increasingly required to have lower profiles so that overall sizes of electronic systems including the image capture units can be reduced while at the same time not sacrifice quality in that optical images that are captured. The profile of an image capture unit may be associated with the distance from the bottom of image sensor to the top of the imaging lens.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

DETAILED DESCRIPTION

In the following description, numerous specific details are set forth in order to provide a thorough understanding of the present invention. It will be apparent, however, to one having ordinary skill in the art that the specific detail need not be employed to practice the present invention. In other instances, well-known materials or methods have not been described in detail in order to avoid obscuring the present invention.

Reference throughout this specification to "one embodiment", "an embodiment", "one example" or "an example" means that a particular feature, structure or characteristic described in connection with the embodiment or example is included in at least one embodiment of the present invention. Thus, appearances of the phrases "in one embodiment", "in an embodiment", "one example" or "an example" in various places throughout this specification are not necessarily all referring to the same embodiment or example. Furthermore, the particular features, structures or characteristics may be combined in any suitable combinations and/or subcombinations in one or more embodiments or examples. Particular features, structures or characteristics may be included in an integrated circuit, an electronic circuit, a combinational logic circuit, or other suitable components that provide the described functionality. In addition, it is appreciated that the figures provided herewith are for explanation purposes to persons ordinarily skilled in the art and that the drawings are not necessarily drawn to scale.

Example methods and apparatuses directed to a low profile image capture unit are disclosed. As will be appreciated, a low profile image capture unit according to the teachings of the present invention may be provided, while the quality of optical images captured such as resolution (i.e., the number of pixels) and sharpness, is not sacrificed for the low profile in accordance with the teachings of the present invention.

Figures 1A, 1B:
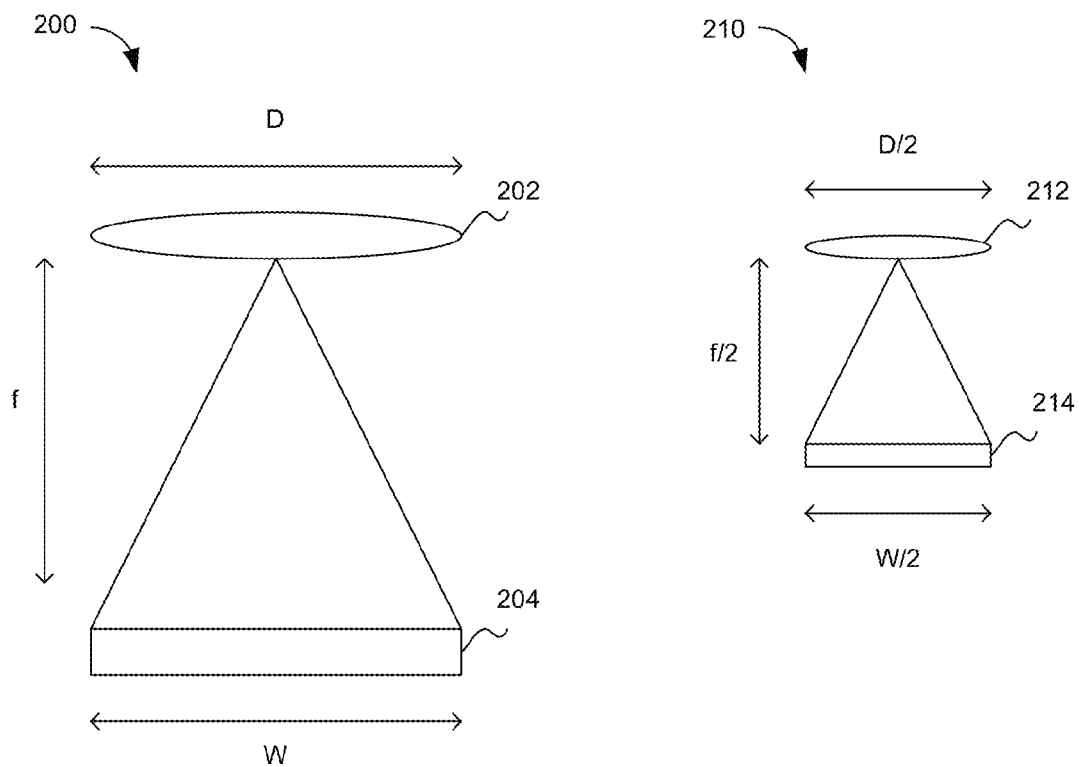
FIG. 1A is a schematic diagram of an image capture unit including an imaging lens and an image sensor.
FIG. 1B is a schematic diagram of a low profile image capture unit including a low profile imaging lens and an image sensor.

To illustrate, FIG. 1A is a schematic diagram of an image capture unit 200 including an imaging lens 202 and an image sensor 204. The distance between lens 202 and image sensor 204 is approximately f, where f is the focal length of lens 202. The width of the image sensor 204 covered by lens 202 is W, and the lens diameter is D. For comparison, FIG. 1B shows a schematic diagram of a low profile image capture unit 210 including an imaging lens 212 and an image sensor 214. The distance between lens 212 and image sensor 214 is approximately f/2, where f/2 is the focal length of lens 212. The width of the image sensor 214 covered by lens 212 is W/2, and the lens diameter is D/2.

In a low profile image capture unit, the imaging lens is replaced with a low profile imaging lens, while the image sensor is unchanged. Image sensors 204 and 214 are the same image sensor, and both image sensors have the same pixel array structure. Since the width of image sensor 214 is half of the width of image sensor 204, image sensor 214 will have half of number of pixels as compared with image sensor 204 in one dimension. In two dimensions, image sensor 214 will have quarter of number of pixels as compared with image sensor 204. In other words, the number of pixels of the image captured is approximately proportional to the square of the scale of the distance between the lens and the image sensor.

Figure 2:
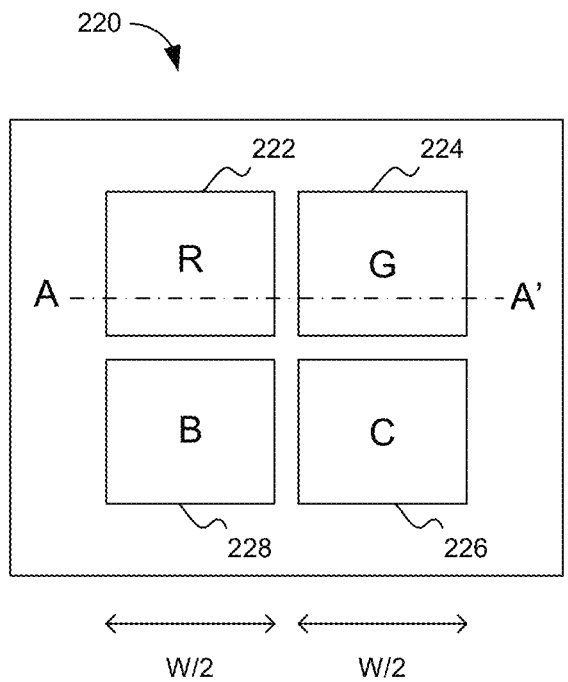
FIG. 2 illustrates one example of an image sensor having four partitioned areas in accordance with the teachings of the present invention.

FIG. 2 illustrates an image sensor 220 having four partitioned areas 222, 224, 226, and 228 closely arranged proximate to each other in accordance with the teachings of the present invention. Each partitioned area 222, 224, 226, and 228 is covered by a respective imaging lens (e.g., lens 212 of FIG. 1B). In this manner, the focal length of the imaging lens (e.g., lens 212 of FIG. 1B) can be half of the imaging lens when the image sensor is not partitioned into four areas (e.g., lens 202 of FIG. 1A). Thus, a low profile image capture unit can be constructed using four lenses and four partitioned areas of an image sensor. The low profile image capture unit will have approximately the same resolution (i.e., the same number of pixels) as compared with the original image capture unit, because four areas of image sensor are used. An area of image sensor may be similar to image sensor 214 of FIG. 1B.

Figure 3:
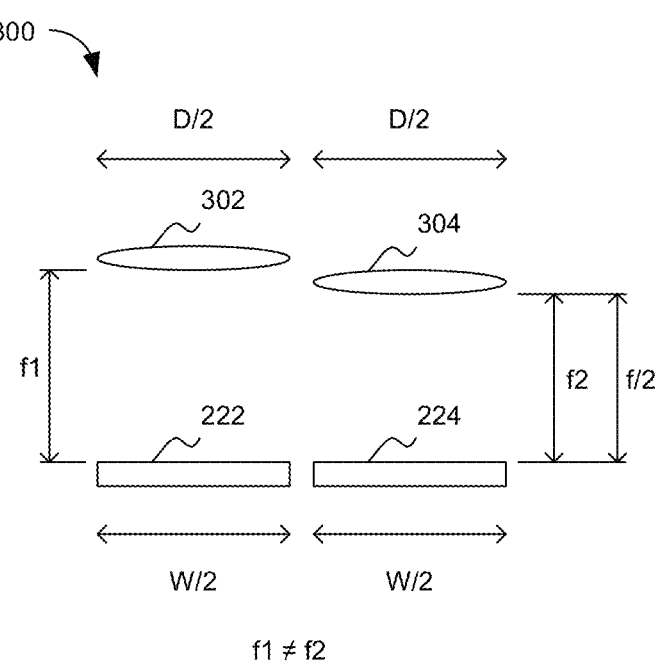
FIG. 3 is a cross-section illustrating two lenses and two partitioned areas of one example of a low profile image capture unit in accordance with the teachings of the present invention.

For illustration, FIG. 3 shows a cross-section of low profile image capture unit 300 including four imaging lenses and four partitioned areas of image sensor in accordance with the teachings of the present invention. In one example, the cross-section illustrated in FIG. 3 may correspond with dashed line A-A' of FIG. 2. The four partitioned areas of image sensor may be areas 222, 224, 226, and 228 of image sensor 220 of FIG. 2. Only two imaging lenses 302 and 304 having focal lengths f1 and f2, respectively, are shown in FIG. 3. Similarly only two partitioned areas 222 and 224 of image sensor 220 are shown in FIG. 3. In this manner, an image capture system having low profile can be constructed, while the resolution (i.e., the number of pixels) of images captured can be maintained.

As shown in the illustrated example, imaging lens 302 is positioned a first focal length f1 away from respective image sensor 222. Imaging lens 304 is positioned a second focal length f2 away from respective image sensor 224. As shown in the depicted example, the second focal length f2 is approximately half of the focal length when compared with lens 202 shown in FIG. 1. Thus, example image capture unit 300 of FIG. 3 is a low profile image capture unit such that the width of the image sensors 222 and 224 covered by lens 302 and 304 are W/2, and the lens diameters of lenses 302 and 304 are D/2 in accordance with the teachings of the present invention.

A typical image capture unit may include a Bayer type color filter array on the image sensor. In contrast, partitioned areas of image sensor 222 and 224 of FIG. 3 may not include Bayer type color filter array. Referring back to FIG. 2, partitioned areas 222, 224, 226, 228 may be designated to red (R), green (G), clear (C), and blue (B) areas, respectively. Red area may be covered by a single red filter, green area may be covered by a single green filter, blue area may be covered by a single blue filter, and clear or C area may not be covered by any filter or may be covered by a single green filter.

As shown in the example, the first focal length f1 is different than the second focal length f2. In one example, the first focal length f1 corresponds with light having a first color, such as for example but not limited to red (R), and second focal length f2 corresponds with light having a second color, such as for example but not limited to green (G). Accordingly, a single image having the first color is focused by lens 302 onto image sensor 222 and the same single image having the second color is focused by lens 304 onto image sensor 224 in accordance with the teachings of the present invention.

Referring briefly back to the example depicted in FIG. 2, the red (R) area includes red pixels only, the green (G) area includes green pixels only, and the blue (B) area includes blue pixels only. The clear or C area may include white pixels when no filter is applied, and green pixels when a green filter is applied. A readout system and/or processor (not shown) may rearrange red, green, and blue pixels into Bayer pattern or any pattern for further processing the color signals and forming the color images. C pixels may be use as white pixels for particular processing or simply contribute as green pixels in accordance with the teachings of the present invention.

Figure 4:
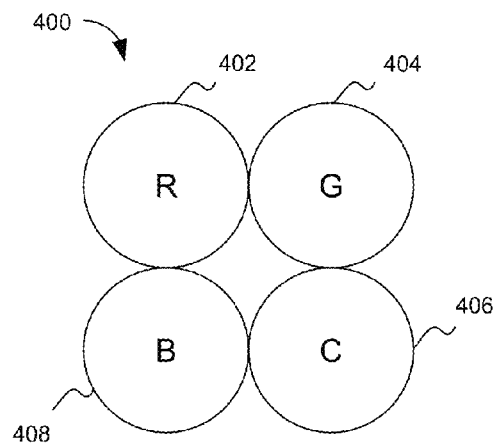
FIG. 4 illustrates one example of a 2×2 lens array for a partitioned image sensor in accordance with the teachings of the present invention.

FIG. 4 illustrates a lens array 400 for the partitioned image sensor in accordance with the teachings of the present invention. The partitioned image sensor may be image sensor 220 of FIG. 2. Lens array 400 may be a 2×2 array having low profile lenses 402, 404, 406, and 408, which are designated to red (R), green (G), clear (C), and blue (B) areas, respectively. In other words, each one of the lenses 402, 404, 406, and 408 is arranged to focus a single image onto a respective one of the red (R), green (G), clear (C), and blue (B) areas image sensor regions. Thus, lens 402 forms a red image only, lens 404 forms a green image only, and lens 408 forms a blue image only. In addition, in one example, each one of the lenses 402, 404, 406, and 408 has a different respective focal length that corresponds with the specific color of light that is being focused onto the corresponding image sensor region in accordance with the teachings of the present invention. In another example, and as will be discussed in further detail below, each one of the lenses 402, 404, 406, and 408 has a different respective radius of curvature that corresponds with the specific color of light that is being focused onto the corresponding image sensor region in accordance with the teachings of the present invention.

In contrast, a typical image capture unit uses a single imaging lens that forms red, green, and blue images simultaneously. However, since each lens 402, 404, 406, and 408 in accordance with the teachings of the present invention forms individually a single color image, the optical quality, e.g., sharpness, of each individual image may be improved by adjusting individually the focal length distance between each lens and the corresponding image sensor. Thus, in one example, the focal length distance between each one of the lenses 402, 404, 406, and 408 and the corresponding partitioned image sensor may be adjusted individually according to the wavelength of light, in order to get a high quality image in accordance with the teachings of the present invention. Accordingly, in one example, the position of red lens relative to the red area of the image sensor, the position of green lens relative to the green area of the image sensor, and the position of blue lens relative to the blue area of the image sensor are different in accordance with the teachings of the present invention. In one example, the position of C lens relative to the C area of the image sensor may be the same as the position of green lens relative to the green area of the image sensor.

Figure 5:
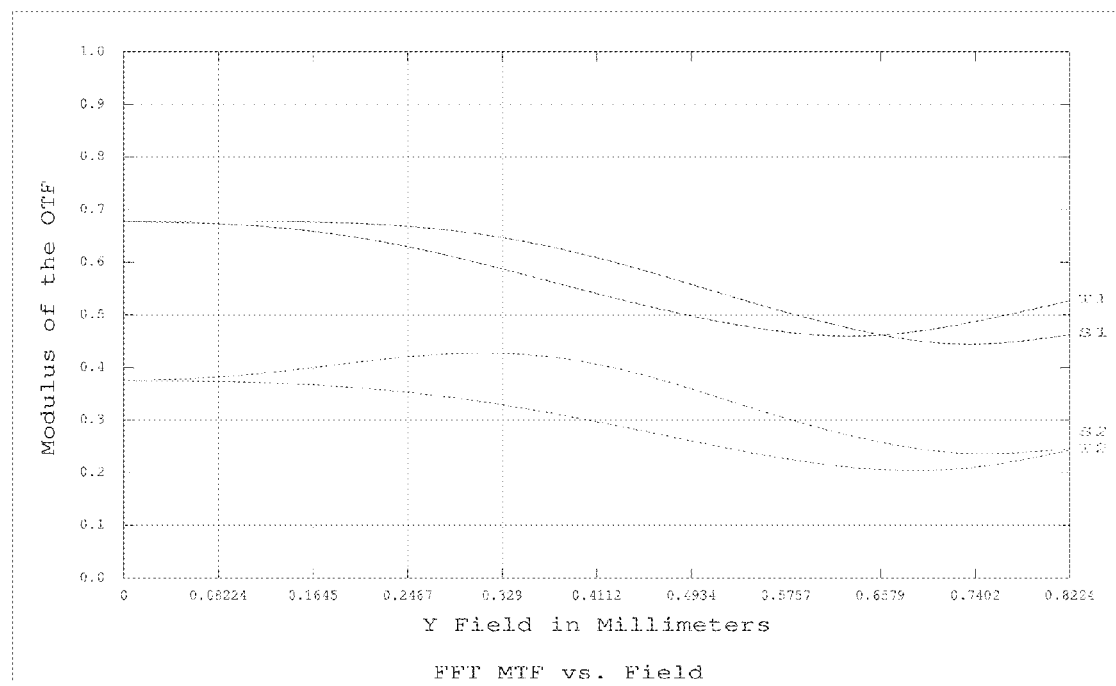
FIG. 5 illustrates one example of the modulation transfer function in balance of RGB of a lens at the designed focus in accordance with the teachings of the present invention.
Figure 6A:
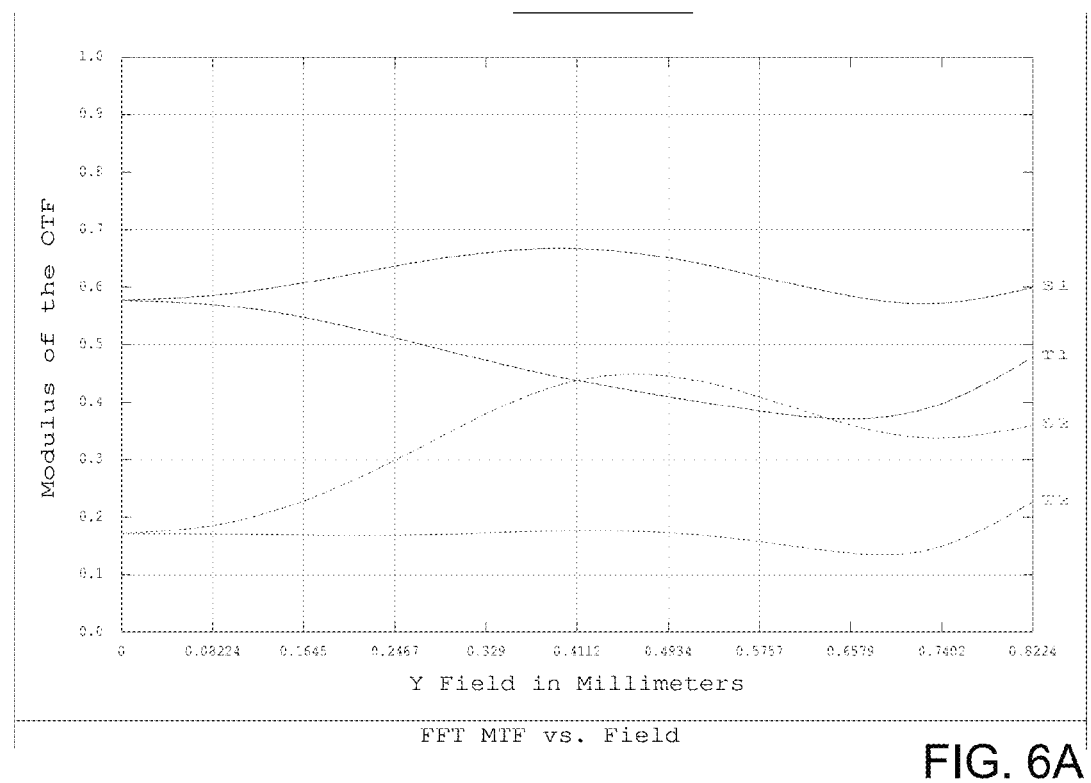
FIG. 6A illustrates one example of the modulation transfer function in individual R of a lens at the designed focus in accordance with the teachings of the present invention.
Figure 6B:
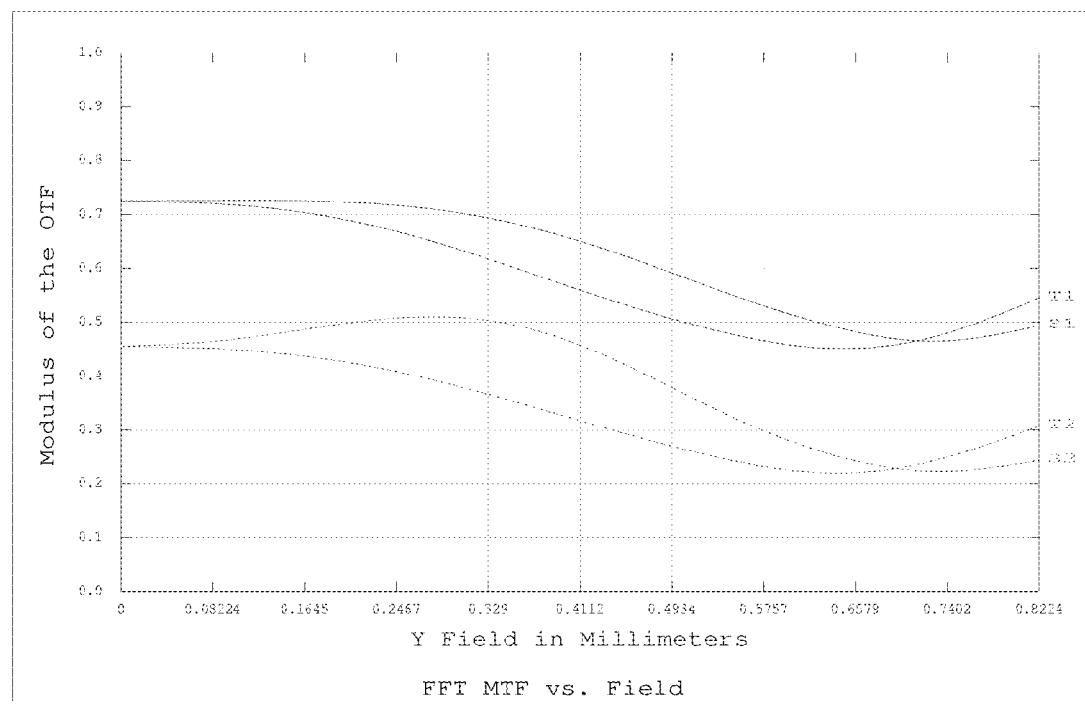
FIG. 6B illustrates one example of the modulation transfer function in individual R of a lens after focus adjustment in accordance with the teachings of the present invention.
Figure 7A:
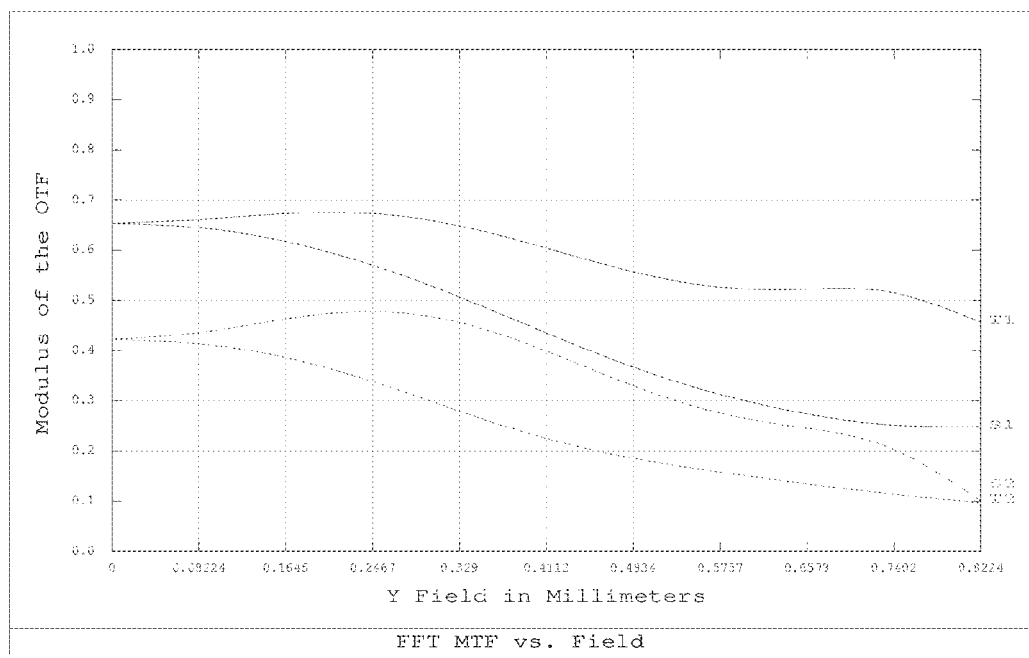
FIG. 7A illustrates one example of the modulation transfer function in individual B of a lens at the designed focus in accordance with the teachings of the present invention.
Figure 7B:
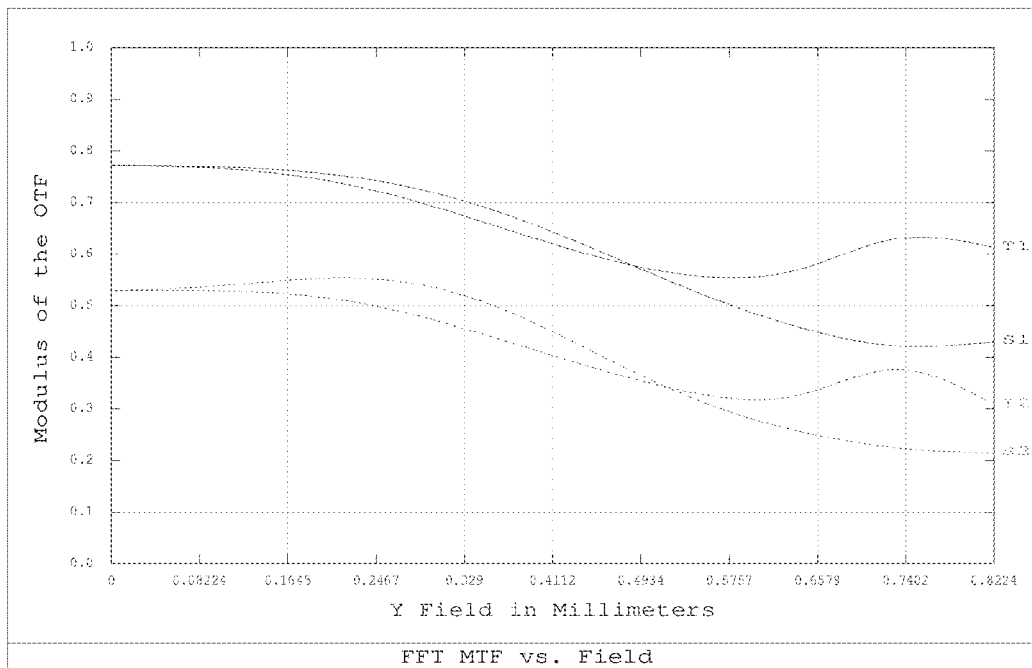
FIG. 7B illustrates one example of the modulation transfer function in individual B of a lens after focus adjustment in accordance with the teachings of the present invention.
Figure 8:
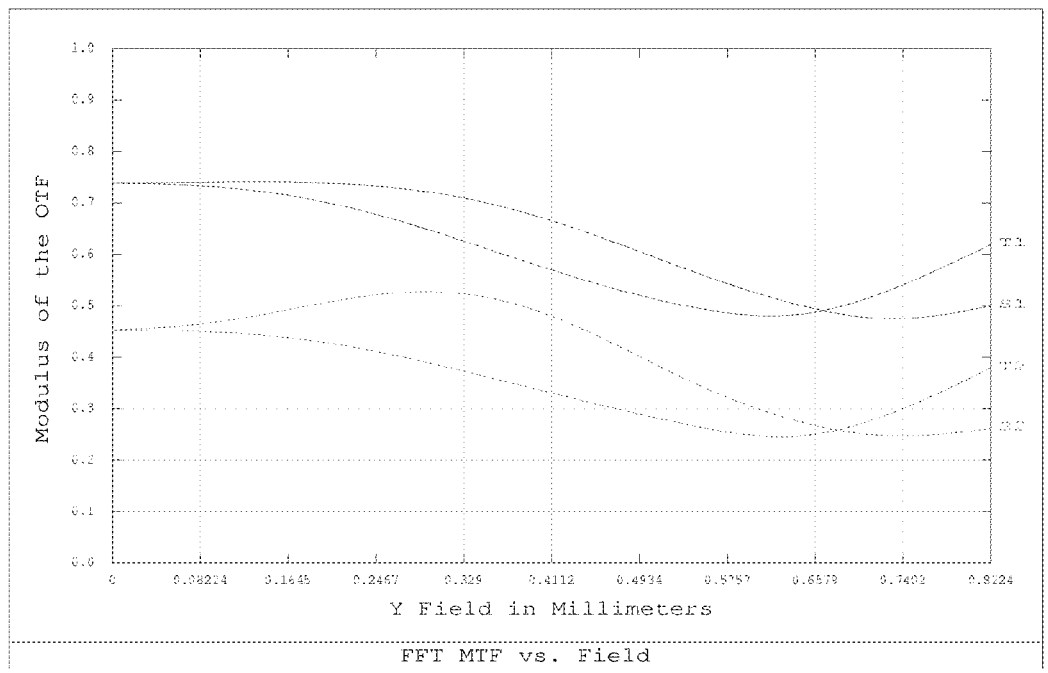
FIG. 8 illustrates one example of the modulation transfer function in individual G of a lens at the designed focus in accordance with the teachings of the present invention.

To illustrate, a lens is designed in balance of RGB color with specific weighting. The modulation transfer function (MTF) in balance of RGB at the designed focus is illustrated in FIG. 5, in accordance with the teachings of the present invention. If the lens is used for red color only (e.g., lens 402 of FIG. 4), the MTF in individual R at the designed focus is illustrated in FIG. 6A, in accordance with the teachings of the present invention. After focus adjustment, the MTF in individual R, which is no longer at the designed focus, is illustrated in FIG. 6B, in accordance with the teachings of the present invention. As can be appreciated, it is apparent that the lens performance illustrated in FIG. 6B is better than the lens performance illustrated in FIG. 6A. Similarly, if the lens is used for blue color only (e.g., lens 408 of FIG. 4), the MTF in individual B at the designed focus is illustrated in FIG. 7A, in accordance with the teachings of the present invention. After focus adjustment, the MTF in individual B, which is no longer at the designed focus, is illustrated in FIG. 7B, in accordance with the teachings of the present invention. As can be appreciated, it is apparent that the lens performance illustrated in FIG. 7B is better than the lens performance illustrated in FIG. 7A. FIG. 8 illustrates the MTF in individual G at the designed focus in accordance with the teachings of the present invention. In the depicted example, no focus adjustment is needed for green color since the balance design in the example is optimized at green color.

Comparing FIG. 6B with FIG. 5, and comparing FIG. 7B with FIG. 5, it is apparent that the MTFs in FIG. 6B and FIG. 7B are overall higher than the MTF in FIG. 5. For example, the peak of MTF in FIG. 5 is less than 0.7, while the peaks of MTFs in FIG. 6B and FIG. 7B are greater than 0.7. The focus adjustment provides MTFs that are even better than the original design because individual narrow bandwidths of wavelength are used. In other words, the image quality, i.e., image sharpness, provided by the focus adjusted individual lens is better than the image quality, i.e., image sharpness, as designed (e.g., MTF in FIG. 5), and than that of the lens before the individual focus adjustment (e.g., MTFs in FIG. 6A and FIG. 7A), in accordance with the teachings of the present invention.

Figure 9:
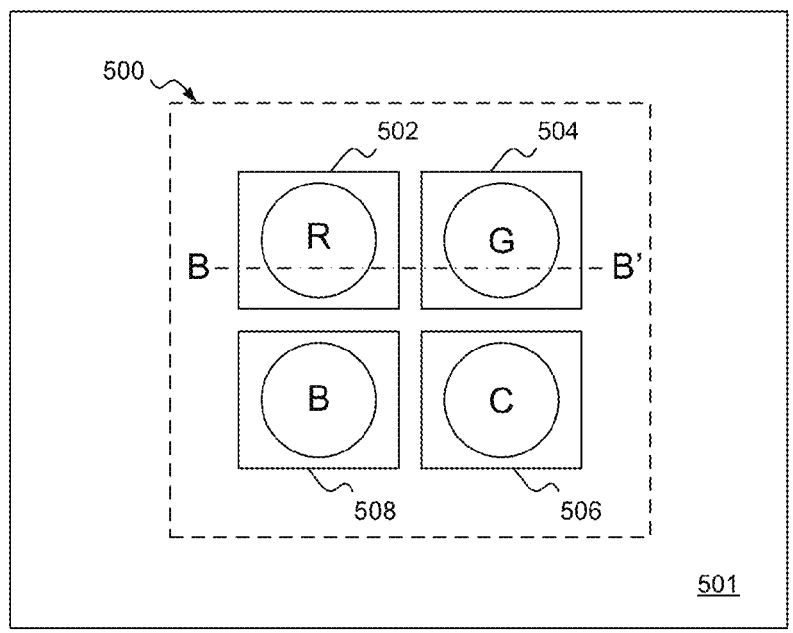
FIG. 9 illustrates one example of a 2×2 lens array on a partitioned image sensor in accordance with the teachings of the present invention.

FIG. 9 illustrates a 2×2 lens array 500 disposed proximate to a partitioned image sensor 501 in accordance with the teachings of the present invention. In one example, lens array 500 may include individual wafer-level lens cubes 502, 504, 506, and 508, which are identical lenses, to focus a single image onto a respective one of the respective partitions of image sensor 501 in accordance with the teachings of the present invention. In the depicted example, lenses 502, 504, 506, and 508 are designated to R, G, C, and B areas, respectively. As described previously, the focal length positions of R lens 502 and B lens 508 may be adjusted according to the specific color from the designed focus. In one example, the positions of G lens 504 and C lens 506 may not need adjustment from the designed focus. In other words, the red focal length and the B focal length are different from the G focal length in accordance with the teachings of the present invention. There are three focal lengths, R focal length, B focal length, and G focal length. Accordingly, the position of R lens relative to R area of the image sensor, the position of G lens relative to G area of the image sensor, and the position of B lens relative to B area of the image sensor are different in accordance with the teachings of the present invention. In one example, the position of C lens relative to C area of the image sensor is the same as the position of G lens relative to G area of the image sensor.

Figure 10:
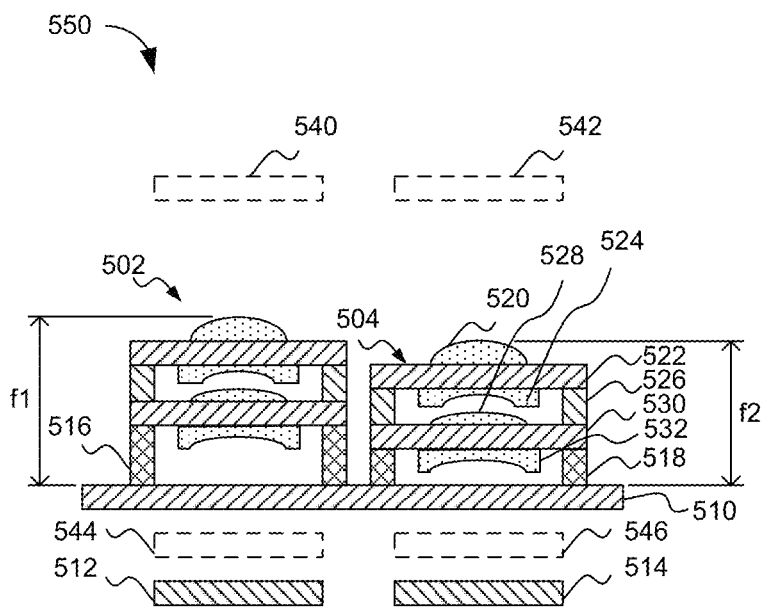
FIG. 10 illustrates the cross section of one example of a 2×2 lens array on a partitioned image sensor in accordance with the teachings of the present invention.

FIG. 10 illustrates the cross-section 550 of 2×2 lens array 500 in accordance with the teachings of the present invention. Only lens cubes 502 and 504 are shown in FIG. 10. In one example, the cross-section illustrated in FIG. 10 may correspond with dashed line B-B' of FIG. 9. Note that lens cubes 502 and 504 in FIG. 10 are equivalent to lenses 302 and 304 in FIG. 3. Accordingly, as shown in the illustrated example, lens cube 502 is positioned a first focal length f1 away from respective image sensor 512 and lens cube 504 is positioned a second focal length f2 away from respective image sensor 514. In the example, the first focal length f1 corresponds to a first color and the second focal length f2 corresponds to a second color. In the example, the first focal length f1 is not the same as the second focal length f2 and the first color is not the same as the second color.

As shown in the depicted example, lens cubes 502 and 504 are disposed on back spacers 516 and 518, respectively. Back spacers 516 and 518 are disposed on a cover glass 510. Partitioned areas 512 and 514 of a single image sensor are under cover glass 510, aligned with lens cubes 502 and 504, respectively. The thickness of back spacer 516 is different from the thickness of back spacer 518 for individual focus adjustment. Three kinds of back spacers having different thicknesses, each for R, G, and B, may be required.

In one example, each wafer-level lens cube includes at least a glass wafer and a lens on the glass wafer. Typically, each wafer-level lens cube may include a lens 520 on a glass wafer 522, a lens 524 on the other side of glass wafer 522, a lens 528 on a glass wafer 530, a lens 532 on the other side of glass wafer 530, and a spacer 526 between glass wafers 522 and 530, and glass wafers 522 and 530.

It is appreciated that a traditional lens, including a molded plastic lens, may be used as well. However, a wafer-level lens cube has some advantages over a traditional lens. For example, multiple plastic lenses may be inserted into a barrel. The barrel may be screwed into a holder that may be fixed on a printed circuit board together with an image sensor. The corresponding barrel and holder may increase the overall dimensions of the lens, which may require a larger gap between the partitioned areas of the image sensor. This may cause increased silicon wafer dimensions, which in turn may increase the total cost of the image sensor.

Figure 11:
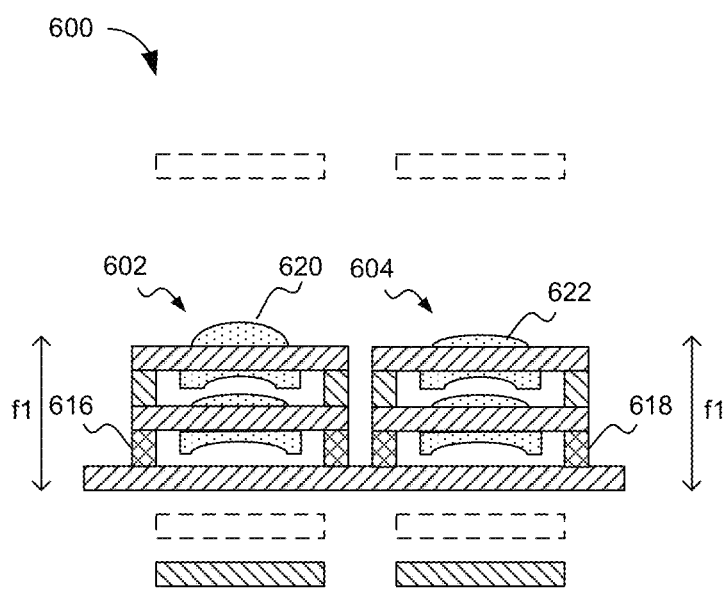
FIG. 11 illustrates the cross section of another example of a 2×2 lens array on a partitioned image sensor in accordance with the teachings of the present invention.

FIG. 11 shows the cross-section of another example of 2×2 lens array 600 in accordance with the teachings of the present invention. Only lens cubes 602 and 604 are shown in FIG. 11. In one example, the cross-section illustrated in FIG. 11 may also correspond with dashed line B-B' of FIG. 9. It is noted that 2×2 lens array 600 of FIG. 11 shares many similarities with 2×2 lens array 550 of FIG. 10. However, back spacers 616 and 618 of lens array 600 have the same thickness when compared to back spacers 516 and 518. Thus, lens cubes 602 and 604 have at least one different radius of curvature (ROC) in accordance with the teachings of the present invention. For example, ROC 620 of R lens cube 602 is different from ROC 622 of G lens cube 604. The difference in ROC causes the focal length f1 at red color of R lens cube 602 equal the focal length f1 at green color of G lens cube 604. Although it is not shown, the ROC of B lens cube is also different from that of R and G lens cubes, and the ROC of C lens cube may be the same as that of G lens cube. Therefore, ROC of R lens cube, ROC of G lens cube, and ROC of B lens cube are different and correspond to the particular color of the single image being focused onto the respective image sensor in accordance with the teachings of the present invention. However, the focal length at red color of R lens, the focal length at green color of G lens, and the focal length at blue color of B lens are the same. Accordingly, positions of each lens relative to the corresponding partitioned image sensor are identical (e.g., f1 as illustrated in FIG. 11), even though the respective radii of curvatures of the lenses are different depending on the color in accordance with the teachings of the present invention.

Figure 12:
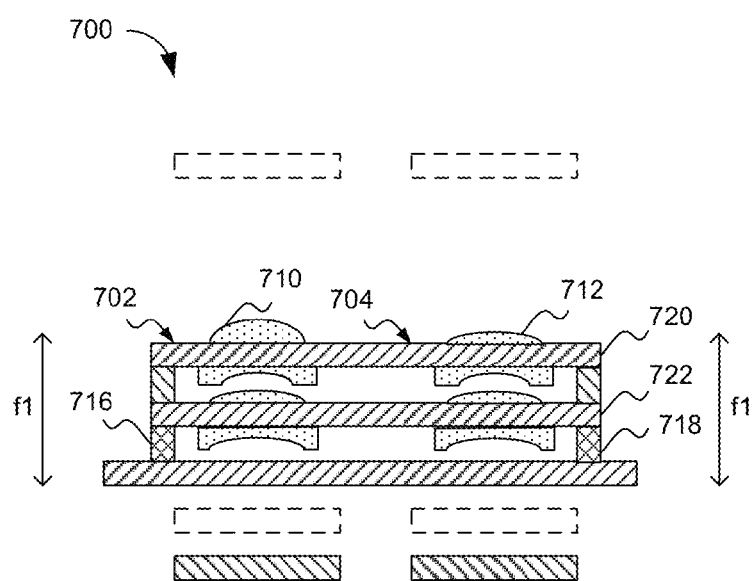
FIG. 12 illustrates the cross section of yet another example of a 2×2 lens array on a partitioned image sensor in accordance with the teachings of the present invention.

FIG. 12 shows the cross section of yet another embodiment of 2×2 lens array 700 in accordance with the teachings of the present invention. In one example, the cross-section illustrated in FIG. 12 may correspond with dashed line B-B' of FIG. 9. In lens array 700, R wafer-level lens cube 702, G wafer-level lens cube 704, C wafer-level lens cube 706, and B wafer-level lens cube 708 are formed on the same wafers. For example, the same wafers may be glass wafers 720 and 722. In the example depicted in FIG. 12, cubes 702, 704, and 708 have different ROCs corresponding to the particular color of the single image being focused onto the respective image sensor partition in accordance with the teachings of the present invention. For example ROC 710 of R lens cube 702 is different from ROC 712 of G lens cube 704. C lens cube 706 has a ROC, which may be the same as that of G lens cube 704. Only lens cubes 702 and 704 are shown in FIG. 12. Back spacers 716 and 718 have the same thickness. Therefore, ROC of R lens cube, ROC of G lens cube, and ROC of B lens cube are different. However, the focal length at red color of R lens, the focal length at green color of G lens, and the focal length at blue color of B lens are of the same f1 value. Accordingly, positions of each lens relative to the corresponding partitioned image sensor are identical (e.g., f1 as illustrated in FIG. 12), even though the respective radii of curvatures of the lenses are different depending on the color in accordance with the teachings of the present invention.

In one example, a single color filter may be disposed above each lens cube. Alternatively, a single color filter may be disposed between each lens cube and each partitioned area of a single image sensor. For example, referring back to FIG. 10, color filters 540 and 542 disposed above lens cube 502 and 504, respectively. Alternatively, color filters 544 and 546 may be disposed between lens cube 502 and partitioned area 512 of image sensor, and lens cube 504 and partitioned area 514 of image sensor, respectively, as also shown in FIG. 10. Only a single color filter for each lens cube, for example, either color filter 540 or color filter 544, is included in the image capture unit.

Figure 13:
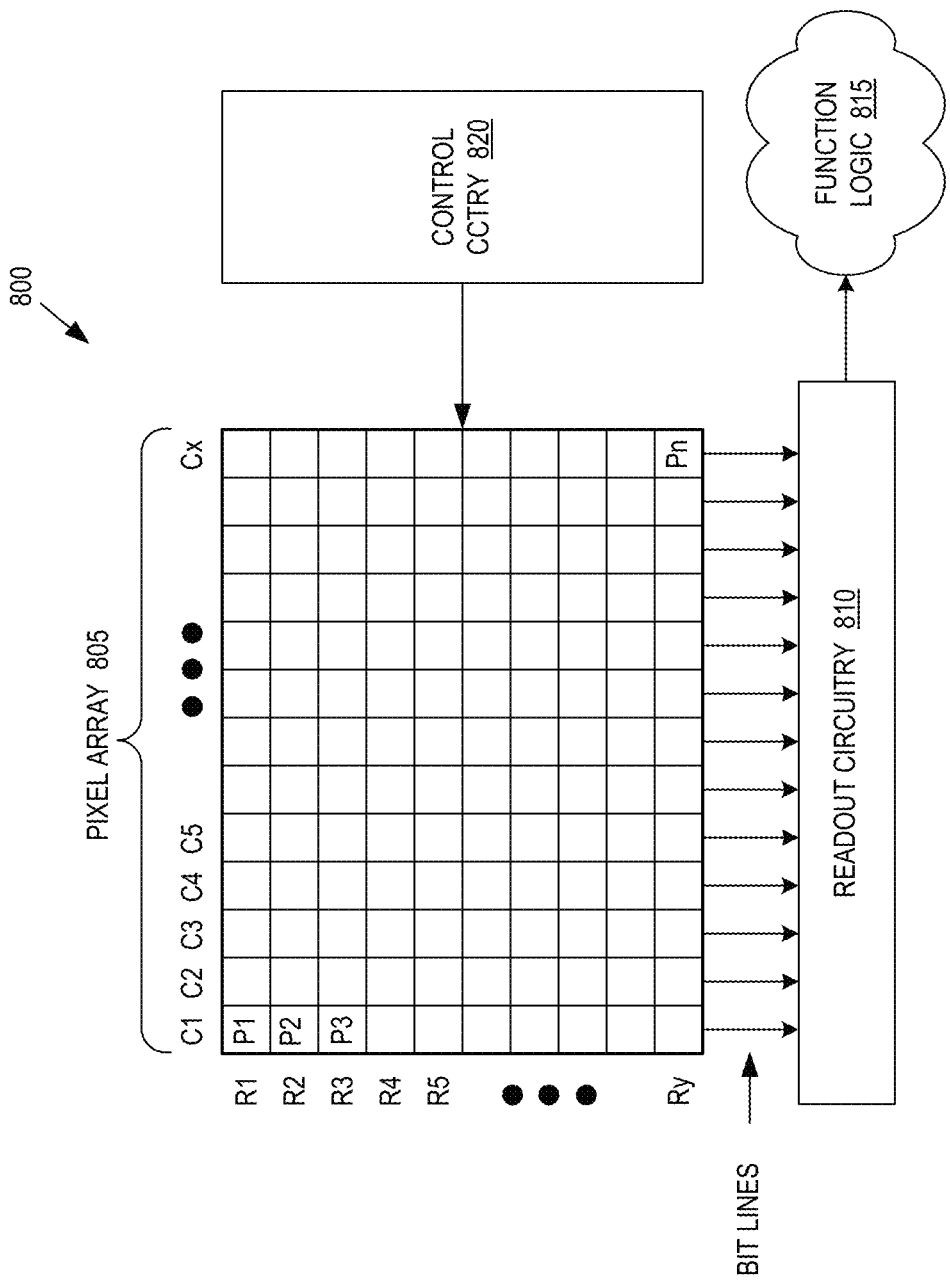
FIG. 13 is a block diagram illustrating one example of an image sensor in accordance with the teachings of the present invention.

FIG. 13 is a block diagram illustrating an image sensor 800, in accordance with the teachings of the present invention. Image sensor 800 is one example implementation of image sensor 220 of FIG. 2, or image sensor 501 of FIG. 9. The illustrated embodiment of image sensor 800 includes a pixel array 805, readout circuitry 810, function logic 815, and control circuitry 820. Pixel array 805 may be partitioned into four partitioned areas such as shown in FIG. 2 (not shown in FIG. 13).

Pixel array 805 is a two-dimensional (2D) array of an image sensor or pixels (e.g., pixels P1, P2, ..., Pn). Each pixel may be a CMOS pixel or a CCD pixel. As illustrated, each pixel is arranged into a row (e.g., rows R1 to Ry) and a column (e.g., column C1 to Cx) to acquire image data of a person, place, object, etc., which can then be used to render a 2D image of the person, place, object, etc. In one example, pixel array 805 is a backside illuminated (BSI) image sensor. In one example, pixel array 805 is a frontside illuminated (FSI) image example, pixel array 805 is partitioned into a plurality of partitioned areas. Each partitioned area is covered by a color filter.

After each pixel has acquired its image data or image charge, the image data is readout by readout circuitry 810 and transferred to function logic 815. Readout circuitry 810 may include amplification circuitry, analog-to-digital (ADC) conversion circuitry, or otherwise. Function logic 815 may simply store the image data or even manipulate the image data by applying post image effects (e.g., crop, rotate, remove red eye, adjust brightness, adjust contrast, or otherwise). In one example, readout circuitry 810 may readout a row of image data at a time along readout column lines (illustrated) or may readout the image data using a variety of other techniques (not illustrated), such as a serial readout or a full parallel readout of all pixels simultaneously.

Control circuitry 820 is coupled to pixel array 805 to control operational characteristic of pixel array 805. For example, control circuitry 820 may generate a shutter signal for controlling image acquisition. In one embodiment, the shutter signal is a global shutter signal for simultaneously enabling all pixels within pixel array 805 to simultaneously capture their respective image data during a single acquisition window. In an alternative embodiment, the shutter signal is a rolling shutter signal whereby each row, column, or group of pixels is sequentially enabled during consecutive acquisition windows.

It is appreciated that the low profile image capture unit is not limited to 2×2 lens array, any size of lens array is possible. Accordingly, the image sensor is not limited to four partitioned areas, any number of partitioned areas is possible. The partitioned area of image sensor may be square or rectangular. The cross section of lens cube may be circular, ellipse, square, or rectangular. The image sensor may be a CMOS image sensor or a CCD.

The above description of illustrated examples of the present invention, including what is described in the Abstract, are not intended to be exhaustive or to be limitation to the precise forms disclosed. While specific embodiments of, and examples for, the invention are described herein for illustrative purposes, various equivalent modifications are possible without departing from the broader spirit and scope of the present invention. Indeed, it is appreciated that the specific example voltages, currents, frequencies, power range values, times, etc., are provided for explanation purposes and that other values may also be employed in other embodiments and examples in accordance with the teachings of the present invention.

What is claimed is:

1. An apparatus, comprising:
an image sensor including N image sensor regions arranged thereon; and
a lens array having N lens structures disposed proximate to the image sensor, wherein each one of the N lens structures is arranged to focus a single image onto a respective one of the N image sensor regions, wherein the N lens structures include a first lens structure having a first focal length and positioned the first focal length away from the respective one of the N image sensor regions, a second lens structure having a second focal length and positioned the second focal length away from the respective one of the N image sensor regions, and a third lens structure having a third focal length and positioned the third focal length away from the respective one of the N image sensor regions, wherein the first, second and third focal lengths are different, wherein the first focal length corresponds with light having a first color, wherein the second focal length corresponds with light having a second color, and wherein the third focal length corresponds with light having a third color; and
first, second and third color filters proximate to the first, second and third lens structures, respectively.

2. The apparatus of claim 1 wherein the first lens structure focuses the single image having the first color on the respective one of the N image sensor regions, wherein the second lens structure focuses the single image having the second color on the respective one of the N image sensor regions, and wherein the third lens structure focuses the single image having the third color on the respective one of the N image sensor regions.

3. The apparatus of claim 1 wherein the N lens structures further include a fourth lens structure having a fourth focal length and positioned the fourth focal length away from the respective one of the N image sensor regions.

4. The apparatus of claim 3 wherein the fourth focal length corresponds with white light.

5. The apparatus of claim 3 wherein the fourth focal length is substantially equal to one of the first, second and third focal lengths.

6. An apparatus, comprising:
an image sensor including N image sensor regions arranged thereon; and
a lens array having N lens structures disposed proximate to the image sensor, wherein each one of the N lens structures is arranged to focus a single image onto a respective one of the N image sensor regions, wherein the N lens structures include a first lens structure having a first radius of curvature and positioned a focal length away from the respective one of the N image sensor regions, a second lens structure having a second radius of curvature and positioned the focal length away from the respective one of the N image sensor regions, and a third lens structure having a third radius of curvature and positioned the focal length away from the respective one of the N image sensor regions, wherein the first, second and third radii of curvature are different, wherein the first radius of curvature corresponds with light having a first color, wherein the second radius of curvature corresponds with light having a second color, and wherein the third radius of curvature corresponds with light having a third color.

7. The apparatus of claim 6 wherein the first lens structure focuses the single image having the first color on the respective one of the N image sensor regions, wherein the second lens structure focuses the single image having the second color on the respective one of the N image sensor regions, and wherein the third lens structure focuses the single image having the third color on the respective one of the N image sensor regions.

8. The apparatus of claim 6 further comprising first, second and third color filters proximate to the first, second and third lens structures, respectively.

9. The apparatus of claim 6 wherein the N lens structures further include a fourth lens structure having a fourth radius of curvature and positioned the focal length away from the respective one of the N image sensor regions.

10. The apparatus of claim 9 wherein the fourth radius of curvature corresponds with white light.

11. An imaging system, comprising:
a pixel array including an image sensor having N image sensor regions arranged therein, wherein each one of the N image sensor regions has a plurality of pixels arranged therein; and
a lens array having N lens structures disposed proximate to the image sensor, wherein each one of the N lens structures is arranged to focus a single image onto a respective one of the N image sensor regions, wherein the N lens structures include a first lens structure having a first focal length and positioned the first focal length away from the respective one of the N image sensor regions, a second lens structure having a second focal length and positioned the second focal length away from the respective one of the N image sensor regions, and a third lens structure having a third focal length and positioned the third focal length away from the respective one of the N image sensor regions, wherein the first, second and third focal lengths are different, wherein the first focal length corresponds with light having a first color, wherein the second focal length corresponds with light having a second color, wherein the third focal length corresponds with light having a third color, wherein the first lens structure focuses the single image having the first color on the respective one of the N image sensor regions, wherein the second lens structure focuses the single image having the second color on the respective one of the N image sensor regions, and wherein the third lens structure focuses the single image having the third color on the respective one of the N image sensor regions;
first, second and third color filters proximate to the first, second and third lens structures, respectively;
control circuitry coupled to the pixel array to control operation of the pixel array; and
readout circuitry coupled to the pixel array to readout image data from the plurality of pixels.

12. The imaging system of claim 11 further comprising function logic coupled to the readout circuitry to store the single image data readout from each one of the N image sensor regions.

13. The imaging system of claim 11 wherein the N lens structures further include a fourth lens structure having a fourth focal length and positioned the fourth focal length away from the respective one of the N image sensor regions.

14. The imaging system of claim 13 wherein the fourth focal length corresponds with white light.

15. The imaging system of claim 13 wherein the fourth focal length is substantially equal to one of the first, second and third focal lengths.

\* \* \* \* \*